United States Patent [19]

Fujii et al.

[11] Patent Number: 5,459,101
[45] Date of Patent: Oct. 17, 1995

[54] METHOD FOR FABRICATING A SEMICONDUCTOR DEVICE COMPRISING A POLYCIDE STRUCTURE

[75] Inventors: Toyokazu Fujii, Moriguchi; Yasushi Naito, Toyonaka, both of Japan

[73] Assignee: Matsushita Electric Industrial Co., Ltd., Osaka, Japan

[21] Appl. No.: 266,218

[22] Filed: Jun. 27, 1994

Related U.S. Application Data

[62] Division of Ser. No. 900,993, Jun. 18, 1992, Pat. No. 5,355,010.

[30] Foreign Application Priority Data

Jun. 21, 1991 [JP] Japan ................. 3-150003

[51] Int. Cl.[6] ............ H01L 21/265; H01L 21/283
[52] U.S. Cl. ............... 437/200; 437/20; 437/34; 437/57; 437/193; 437/956
[58] Field of Search ................ 437/193, 200, 437/57, 34, 20, 956

[56] References Cited

U.S. PATENT DOCUMENTS

| | | | |
|---|---|---|---|
| 4,597,163 | 7/1986 | Tsang .................... | 437/200 |
| 4,640,844 | 2/1987 | Nappl et al. | |
| 4,703,552 | 11/1987 | Baldi et al. .............. | 437/45 |
| 4,786,611 | 11/1988 | Pfiester .................. | 437/45 |
| 4,876,213 | 10/1989 | Pfiester .................. | 437/34 |
| 4,985,746 | 1/1991 | Asahina. | |
| 5,032,537 | 7/1991 | Yoshizumi et al. ......... | 437/57 |
| 5,086,006 | 2/1992 | Ashina .................... | 437/34 |
| 5,190,880 | 3/1993 | Schwalke et al. .......... | 437/57 |

FOREIGN PATENT DOCUMENTS

| | | |
|---|---|---|
| 57-192079 | 11/1982 | Japan. |
| 61-225838 | 10/1986 | Japan .................... 437/200 |
| 1-205417 | 8/1989 | Japan .................... 437/200 |
| 1265542 | 10/1989 | Japan. |
| 2192161 | 7/1990 | Japan. |
| 3-41762 | 2/1991 | Japan. |
| 4-150019 | 5/1992 | Japan .................... 437/200 |

OTHER PUBLICATIONS

"Gallium–Doped Titanium Silicide for Low Contact Resistivity", IBM Tech. Disc. Bull., 29(11), Apr. 1987, pp. 4969–4970.

H. Hayashida et al. "Dopant Redistribution in Dual Gate W–Polycide CMOS and its Improvement by RTA", *1989 Symposium on VLSI Technology*; IEEE Cat. No. 89, May 22–25, 1989, pp. 29–30.

"A Fine–Line CMOS Technology that uses $P^+$–Polysilicon/ Silicide Gates for NMOS and PMOS Devices" by L. C. Parillo et al.; IEDM Dec. 1984, pp. 418–422.

"Technology Limitations for $N^+/P^+$Polycide Gate CMOS due to Lateral Dopant Diffusion in Silicide/Polysilicon Layers"; by Charles L. Chu et al.; IEEE Electron Device Letters, vol. 12, No. 12; Dec. 1991; pp. 696–698.

*Primary Examiner*—T. N. Quach
*Attorney, Agent, or Firm*—Ratner & Prestia

[57] ABSTRACT

A semiconductor device comprising a semiconductor substrate, an insulating film formed on the semiconductor substrate, and a polycide film including a polysilicon layer and a silicide layer formed on the insulating film. The polysilicon layer includes a p-type region having p-type impurities diffused therein and an n-type region having n-type impurities diffused therein. The p-type impurities are implanted into the silicide layer in order to have a substantially uniform concentration over the entire portion thereof, so that the p-type impurities in the p-type region of the polysilicon layer do not diffuse into the silicide film by a post heat treatment.

9 Claims, 6 Drawing Sheets

METHOD FOR FABRICATING A SEMICONDUCTOR DEVICE COMPRISING A POLYCIDE STRUCTURE

This application is a division of application Ser. No. 07/900,993, filed Jun. 18, 1992, U.S. Pat. No. 5,355,010.

BACKGROUND OF THE INVENTION

1. Field of the Invention

The present invention relates to a semiconductor device comprising a polycide structure composed of a polysilicon layer and a silicide layer, in which both p-type regions and n-type regions are present in the polysilicon layer in a mixed condition, and a method for fabricating such a semiconductor device.

2. Description of the Prior Art

In recent years, it has been known that, in order to reduce the size of an MOS transistor, it is advantageous to use $p^+$-type polysilicon for the gate electrode of a p-channel MOS transistor and $n^+$-type polysilicon for the gate electrode of an n-channel MOS transistor. This technique is described, for example, in IEEE, IEDM, Technical Digest, pp. 418–422 (1984).

Also, $p^+$-type polysilicon is used for a polysilicon layer so as to contact with a $p^+$-type region formed in a semiconductor substrate, and $n^+$-type polysilicon is used for a polysilicon layer so as to contact with an $n^+$-type region formed in the semiconductor substrate. Therefore, in a CMOS semiconductor device in which both p-channel and n-channel MOS transistors are formed on one semiconductor substrate, it is advantageous to form both $p^+$-type regions and $n^+$-type regions in one polysilicon layer in a mixed condition, in order to reduce the size of an integrated circuit device as well as other purposes.

The polysilicon layer in which $p^+$-type regions and $n^+$-type regions are present in a mixed condition has a high specific resistance compared with that of a general metal layer. For this reason, it is a general practice to deposit on the polysilicon layer a metal silicide layer having a comparatively low specific resistance and a high melting point, so as to form a polycide film. In this two-layer polycide film, the $p^+$-type regions and the $n^+$-type regions of the polysilicon layer can electrically communicate with each other through the metal silicide layer formed on the polysilicon layer, thereby eliminating the necessity of an additional contact area for the connection between the $p^+$-type regions and the $n^+$-type regions. Further, since all materials constituting the polycide film have a high melting point of no less than 1000° C., the polycide film can be subjected to heat treatment at 900° C. so as to be planarized using a BPSG film (silicate glass containing boron and phosphorus). This type of semiconductor device is disclosed, for example, in Japanese Laid-Open Patent Publication No. 57-192079.

However, in the polycide film formed by simply depositing silicide on the polysilicon layer, when it is subjected to heat treatment in a post-process such as the planarization using the BPSG film, boron, which is a p-type impurity contained in the $p^+$-type region of the polysilicon layer, and phosphorous or arsenic, which is an n-type impurity contained in the $n^+$-type region thereof, diffuse into the silicide layer and become mixed with each other. This causes a problem of an unstabilized threshold voltage (Vt) when the polycide film is used for a gate electrode of a p-channel MOSFET, though this does not occur for an n-channel MOSFET. This problem is described, for example, in IEEE, Electron Device Letter, vol. 12, pp. 696–698, 1991. Another problem is that the contact resistance of the polycide film increases when it is used for the interconnection between an $n^+$-type diffusion layer and a $p^+$-type diffusion layer.

In order to prevent the diffusion of the impurities into the silicide layer, a technique of forming a diffusion barrier made of titanium nitride (TiN), for example, between the polysilicon layer and the silicide layer has been disclosed, for example, in Japanese Laid-Open Patent Publications No. 1-265542 and No. 2-192161.

However, the effect of the TiN film as the diffusion barrier is not stable because it varies depending on process parameters such as the composition ratio of N/Ti, the amount of oxygen contained as an impurity, the grain size, and the crystal orientation. In particular, when the polycide film is sued for interconnections, the thickness of the TiN film is reduced at the contact areas, and thus the effect of the diffusion barrier is lost. Consequently, p-type impurities and n-type impurities contained in the polysilicon layer diffuse into the silicide layer, and through the silicide layer, the p-type impurities reach the $n^+$-type polysilicon region and the p-type impurities reach the $p^+$-type polysilicon region. As a result, the concentration of electric carriers is lowered due to the compensation effect, which in turn causes the problem of increased contact resistance.

SUMMARY OF THE INVENTION

The semiconductor device of this invention comprises a semiconductor substrate, an insulating film formed on the semiconductor substrate, and a polycide film formed on the insulating film; wherein the polycide film comprises: a polysilicon layer formed on the insulating film, the polysilicon layer including a p-type region having p-type impurities diffused therein and an n-type region having n-type impurities diffused therein; and a silicide layer having the p-type impurities diffused substantially uniformly over the entire portion thereof.

In another aspect of the present invention, a method for fabricating a semiconductor device is provided, which comprises the steps of forming a polysilicon layer; forming a p-type region and an n-type region in the polysilicon layer; forming a silicide layer on the polysilicon layer; and implanting p-type impurities into the silicide layer so that the p-type impurities are substantially uniformly distributed in the silicide layer.

Alternatively, according to the present invention, a method for fabricating a semiconductor device is provided, which comprises the steps of: forming a polysilicon layer; forming a p-type region and an n-type region in the polysilicon layer; forming a silicide layer on the polysilicon layer; and implanting p-type impurities into at least a portion of the silicide layer located on the n-type region of the polysilicon layer.

Thus, according to the present invention, boron, which is a p-type impurity contained in the $p^+$-type polysilicon region, does not diffuse into the silicide layer by heat treatment at 900° C., because boron is implanted in the silicide layer and the boron concentration therein is uniform (i.e., the concentration gradient of boron in the silicide layer is substantially zero). Therefore, the boron concentration in the $p^+$-type polysilicon region does not decrease. Further, boron in the silicide layer does not substantially diffuse into the $n^+$-type polysilicon region, so that the $n^+$-type polysilicon region can maintain the n-type conductivity.

Moreover, due to the polycide film applied for the present invention, the electric communication between the $p^+$-type and the $n^+$-type polysilicon region is possible through the silicide layer without the necessity of an additional contact area. Also, the polycide film employed in the semiconductor device of the present invention can be subjected to heat treatment at about 900° C. in a post-process such as planarization using a BPSG film.

Thus, the invention described herein makes possible the advantages of providing a semiconductor device in which when the polycide film thereof is used for gate electrodes for a p-channel MOSFET, as well as for an n-channel MOSFET, a threshold voltage (Vt) can be stabilized after heat treatment, and when it is used for interconnection between the $n^+$-type diffusion layer and the $p^+$-type diffusion layer, the $p^+$-type contact resistance, as well as the $n^+$-type contact resistance, can be kept low. A method for fabricating such a semiconductor device can also be provided.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

An example of the semiconductor device according to the present invention will be described with reference to the attached drawings. In this case, a two-layer structure called a polycide is used for gate electrodes.

Figure 1:
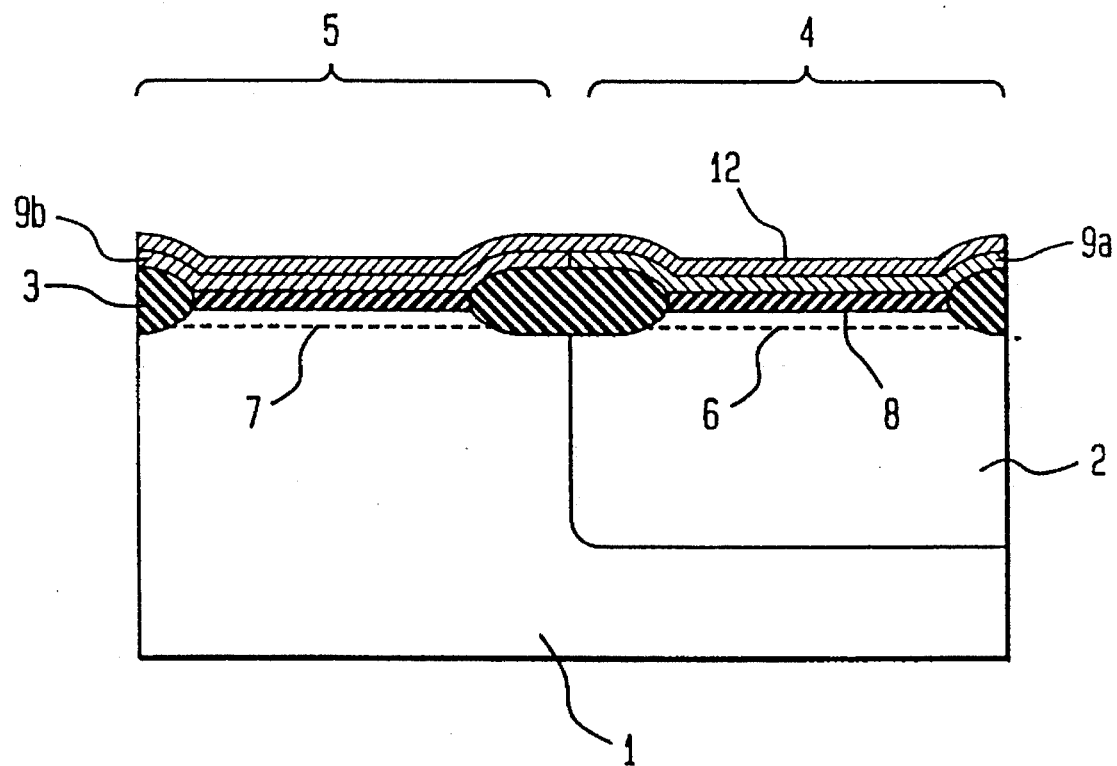
FIG. 1 is a sectional structural view of a main portion of a semiconductor device according to the present invention.

FIG. 1 is a sectional structural view of a main portion of the semiconductor device of this example. The semiconductor device comprises a p-type silicon substrate 1, an $n^-$-type well 2 formed in the silicon substrate 1, isolation regions 3, a $p^+$-type diffusion layer 6 which is to be source/drain regions for a p-channel MOS transistor, an $n^+$-type diffusion layer 7 which is to be source/drain regions for an n-channel MOS transistor, a gate oxide film 8, a polysilicon layer 9 composed of a $p^+$-type polysilicon region 9a and an $n^+$-type polysilicon region 9b, and a tungsten silicide layer 12 having a zero concentration gradient of boron. The reference numerals 4 and 5 denote a p-channel MOS transistor area and an n-channel MOS transistor area, respectively. The polysilicon layer 9 and the tungsten silicide layer 12 form a polycide film. The $p^+$-type diffusion layer 6 and the $n^+$-type diffusion layer 7 are not formed directly under gate electrodes.

Now, referring to FIGS. 2A to 2C, the method for fabricating the above semiconductor device will be described.

Figure 2A:
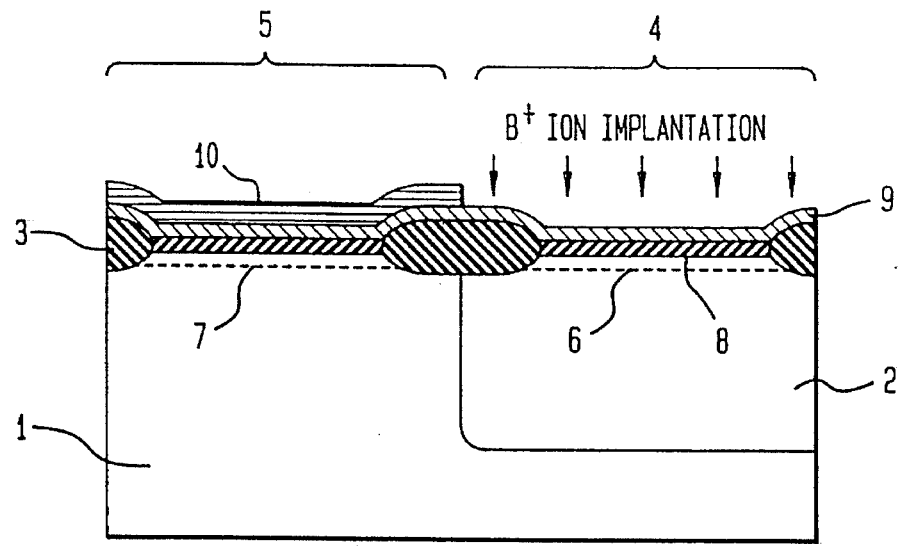
FIGS. 2A to 2C are sectional views of the main portion of the semiconductor device of FIG. 1, describing the fabrication process thereof.

Referring to FIG. 2A, the $n^-$-type well 2 is formed in the p-type silicon substrate 1 having a (100) orientation by an ion implantation method and a thermal diffusion method. The isolation regions 3 are formed on the substrate 1 by a typical selective oxidation method. In this way, the p-channel MOS transistor area 4 is formed on the portion of the substrate 1 where the $n^-$-type well 2 has been formed, while the n-channel MOS transistor area 5 is formed on the other portion of the substrate 1 where the $n^-$-type well 2 has not been formed.

Then, the gate oxide film 8 with a thickness of 10 nm is formed on the substrate 1, and polysilicon is deposited on the gate oxide film 8 to form the polysilicon layer 9 by a chemical vapor deposition method. Then, the n-channel MOS transistor area 5 is covered with a photoresist 10, and $B^+$ ions are implanted into the polysilicon layer 9 at a dose of $6\times10^{15}$ cm$^{-2}$ at an accelerating energy of 10 KeV, so as to form the $p^+$-type polysilicon region 9a.

Figure 2B:
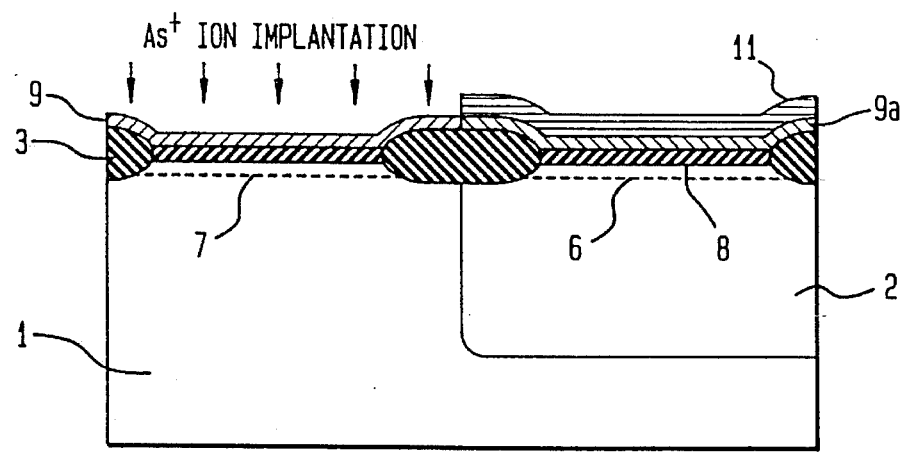

Referring to FIG. 2B, after the removal of the photoresist 10, the p-channel MOS transistor area 4 is covered with a photoresist 11, and $As^+$ ions are implanted into the polysilicon layer 9 at a dose of $1\times10^{15}$ cm$^{-2}$ at an accelerating energy of 20 KeV, so as to form the $n^+$-type polysilicon region 9b.

Figure 2C:
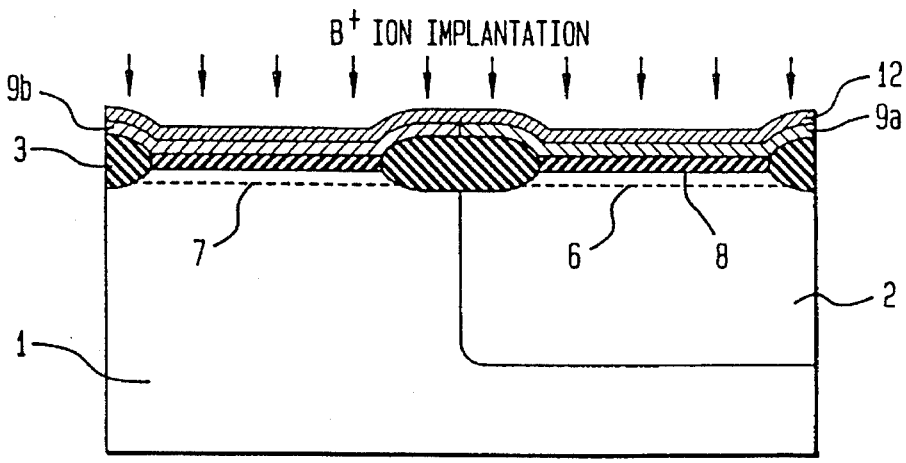

Referring to FIG. 2C, after the removal of the photoresist 11, the tungsten silicide layer 12 with a thickness of 200 nm is formed on the polysilicon layer 9. Then, $B^+$ ions are implanted into the entire portion of the tungsten silicide layer 12 at a dose of $6\times10^{15}$ cm$^{-2}$ at an accelerating energy of 10 KeV, so as to obtain a laterally uniform concentration of boron in the tungsten silicide layer 12. At this time, the boron concentration in the tungsten silicide layer 12 is substantially the same as, and preferably higher than that in the $p^+$-type polysilicon region 9a, so that the diffusion of boron ions from the latter to the former can be prevented.

Then, a silicon oxide film with a thickness of 200 nm is formed on the entire surface of the tungsten silicide layer 12. Subsequently, the $p^+$-type polysilicon region 9a, the $n^+$-type polysilicon region 9b, the tungsten silicide layer 12, and the silicon oxide film are etched so that a desired pattern can be obtained. In this way, not only a pattern of gate electrodes but also a pattern of interconnection between the gate electrode of the p-channel MOS transistor and the gate electrode of the n-channel MOS transistor, for example, can be formed simultaneously.

Then, $BF_2^+$ ions are implanted into the surface portion of the p-channel MOS transistor area 4 at a dose of $6\times10^{15}$ cm$^{-2}$ at an accelerating energy of 30 KeV, so as to form the $p^+$-type diffusion layer 6 as the source/drain regions. On the other hand, $As^+$ ions are implanted at a dose of $6\times10^{15}$ m$^{-2}$ at an accelerating energy of 40 KeV in the surface portion of the n-channel MOS transistor area 5, so as to form the $n^+$-type diffusion layer 7 as the source/drain regions. Then, wirings of aluminum alloy, for example, are formed so as to contact the source, drain, and gate electrodes by known methods of forming an insulating film and of forming a wiring, to finally complete a semiconductor device.

Figure 3A:
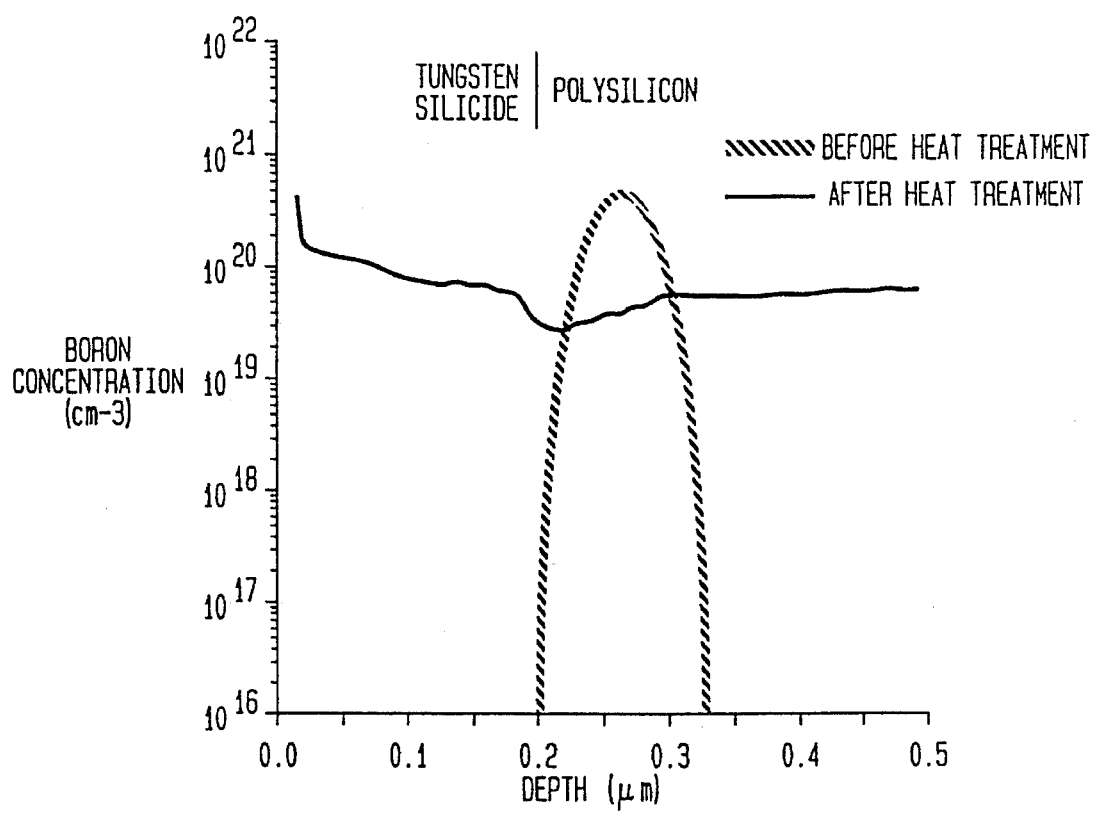
FIGS. 3A and 3B are distributions of boron in the polycide film after heat treatment, respectively.
Figure 3B:
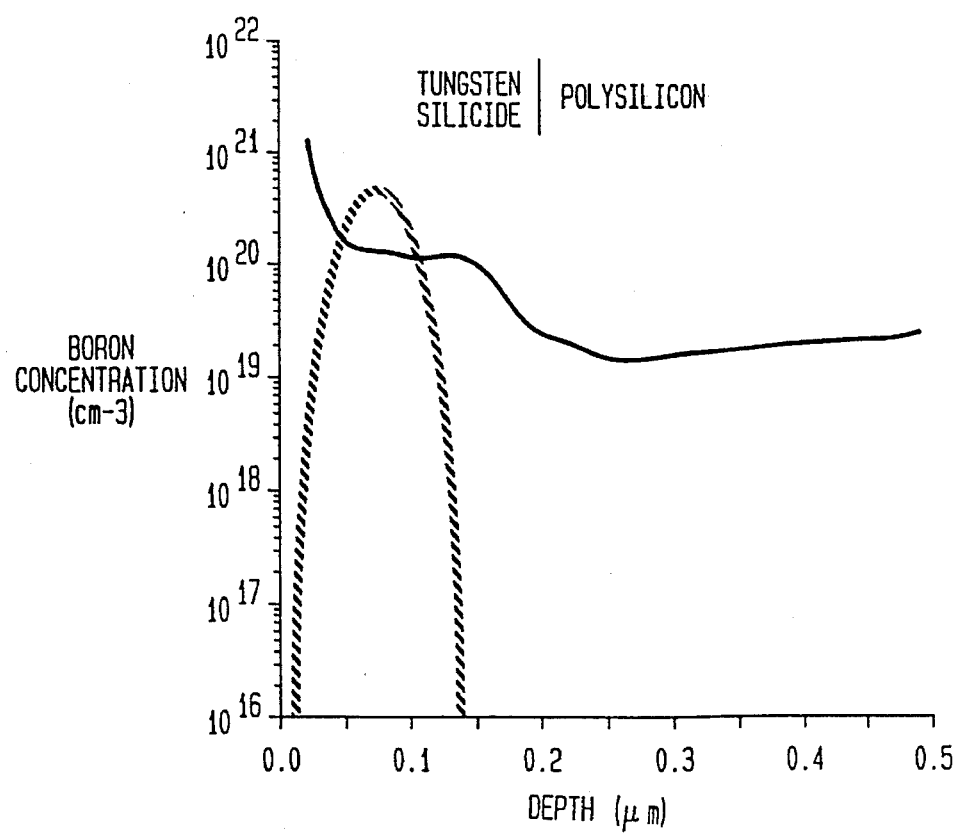

The distribution of the impurities in the polycide film after heat treatment was analyzed. FIGS. 3A and 3B, respectively, show the distributions of the boron concentrations before and after heat treatment in the polycide film composed of the tungsten silicide layer and the polysilicon layer with respect to the thickness thereof. The heat treatment was performed at a temperature of 900° C. for 30 minutes.

FIG. 3A shows the distribution of the boron concentration in a sample of the polycide film in which boron was implanted only in the polysilicon layer and is not present in the tungsten silicide layer. As shown in this figure, after the heat treatment, 60–90% of the boron in the polysilicon layer diffused into the tungsten silicide layer, even up to the surface portion thereof, resulting in a reduced boron concentration in the polysilicon layer.

Figure 5A:
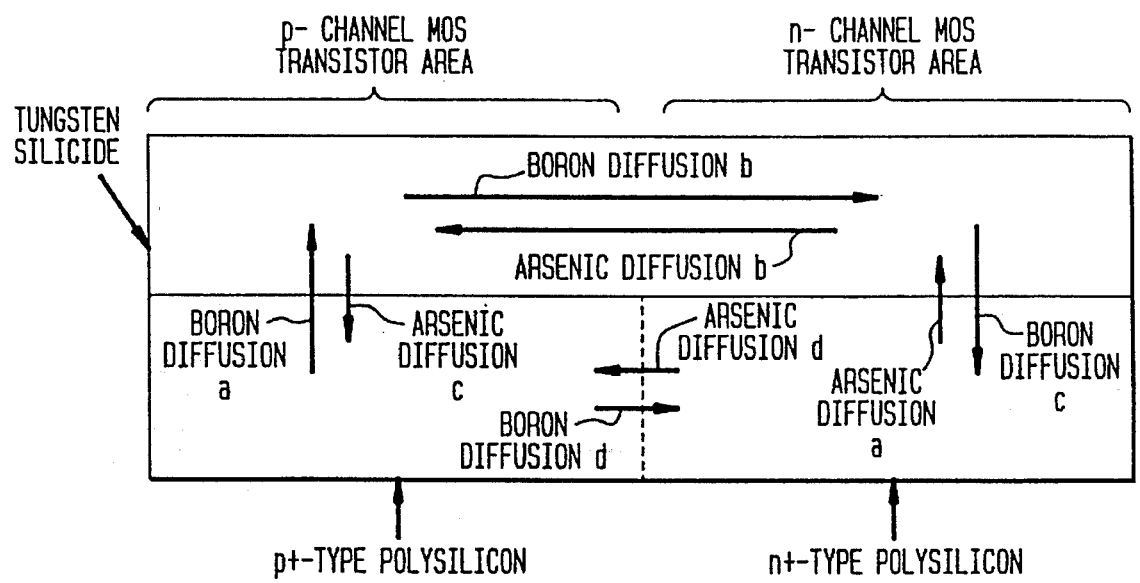
FIGS. 5A and 5B are schematic views showing the diffusion paths of impurities, respectively.

FIG. 5A schematically shows diffusion paths of the impurities in a conventional semiconductor device. Each arrow in the figure shows a diffusion path of impurities. A diffusion path shown by a thicker arrow indicates that the amount of diffusion is larger. The above-described diffusion of boron from the polysilicon layer to the tungsten silicide layer corresponds to boron diffusion a in this figure. The amount of this diffusion is very large as shown in FIG. 3A.

In the semiconductor device comprising both the p-channel MOS transistor and the n-channel MOS transistor, when boron is not present in the portion of the tungsten silicide layer in the $n^+$-type polycide region, boron present in the $p^+$-type polysilicon region diffuses into the portion of the tungsten silicide layer in the $n^+$-type polycide region through the portion of the tungsten silicide layer in the $p^+$-type polycide region, causing a further decrease of the boron concentration in the $p^+$-type polysilicon region. This diffusion corresponds to boron diffusion b in FIG. 5A, and the amount thereof is very large.

FIG. 3B shows the distribution of the boron concentrations in a sample of the polycide film in which boron was implanted only in the tungsten silicide layer. As shown in this figure, after the heat treatment, no more than 10% of boron in the tungsten silicide layer diffused into the polysilicon layer. The amount of the boron diffusion is reduced when arsenic is contained in the polysilicon layer. This diffusion of boron corresponds to boron diffusion c in FIG. 5A, and the amount thereof is small. This indicates that the boron concentration is balanced when the concentration in the silicide layer is higher than that in the polysilicon layer. Boron diffusion d within the polysilicon layer is very small compared with boron diffusion b within the silicide layer.

Figure 4A:
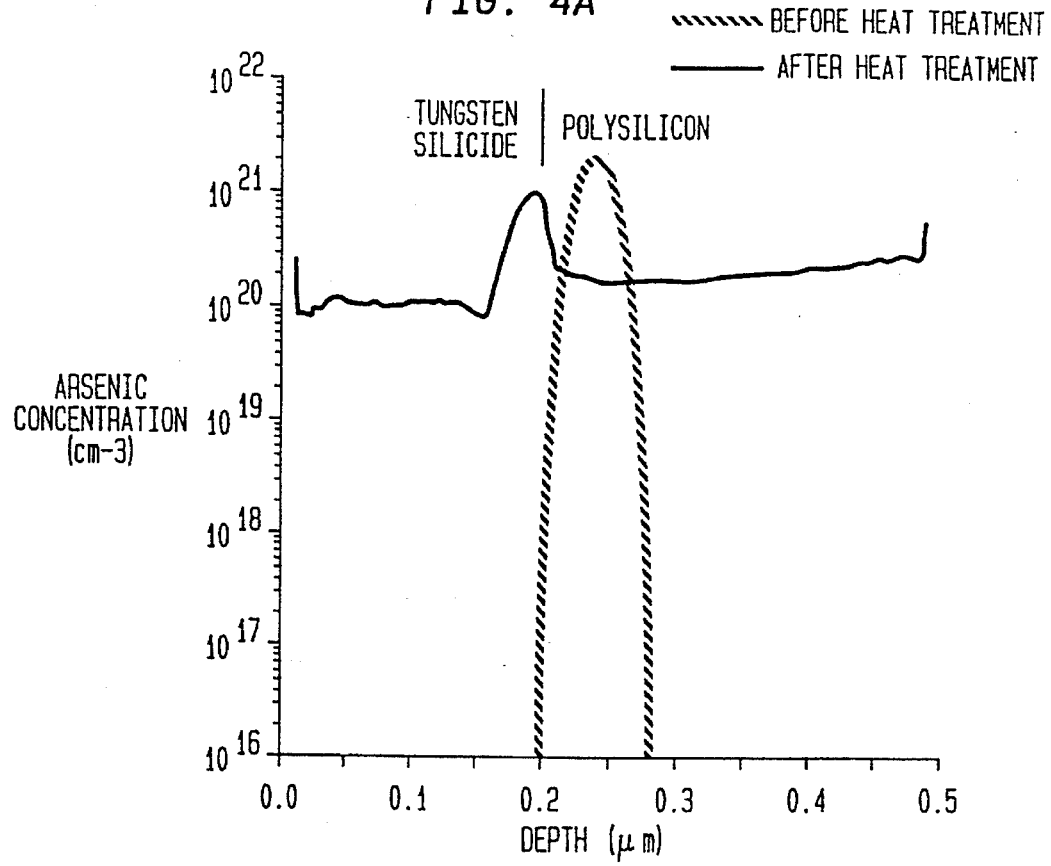
FIGS. 4A and 4B are distributions of arsenic in the polycide film after heat treatment, respectively.
Figure 4B:
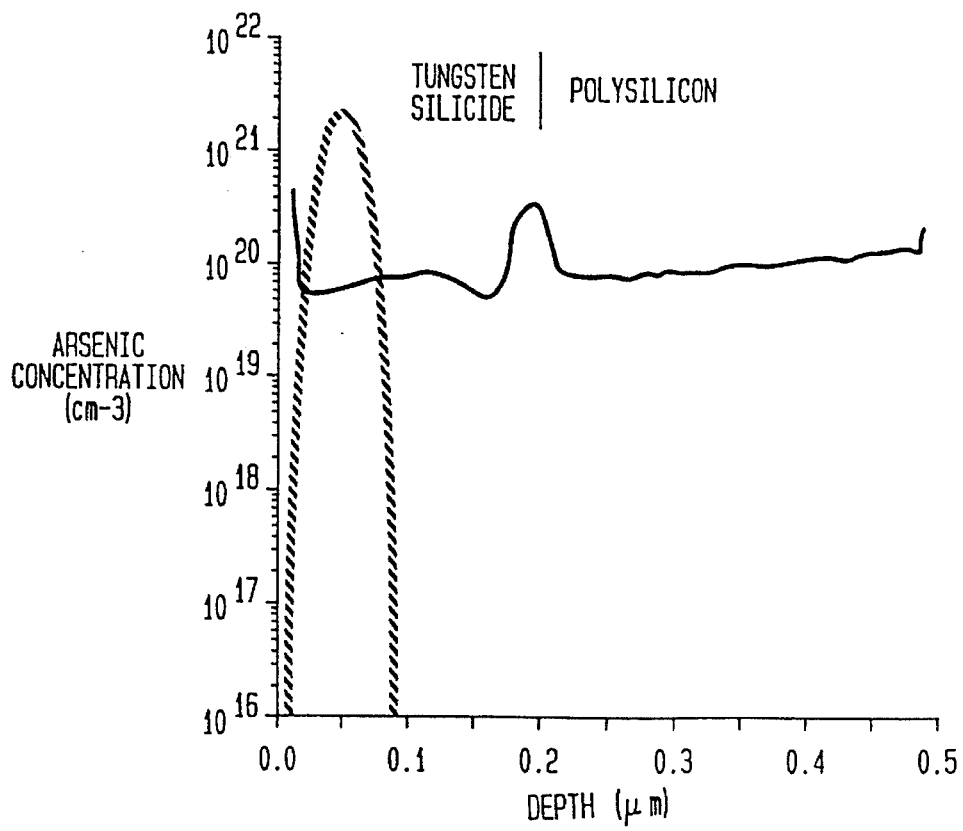

FIGS. 4A and 4B respectively show the distributions of the arsenic concentrations before and after the heat treatment in the polycide film composed of the tungsten silicide layer and the polysilicon layer with respect to the thickness thereof. The heat treatment after the implantation of arsenic was performed at a temperature of 900° C. for 30 minutes.

FIG. 4A shows the distribution of the arsenic concentrations in a sample of the polycide film in which arsenic was implanted only in the polysilicon layer. As shown in this figure, after the heat treatment, no more than 30% of arsenic in the polysilicon layer diffused into the tungsten silicide layer. This diffusion of arsenic corresponds to arsenic diffusion a in FIG. 5A, and the amount thereof is small.

FIG. 4B shows the distribution of the arsenic concentrations in a polycide film in which the arsenic was implanted only in the tungsten silicide layer. As shown in this figure, after the heat treatment, no less than 60% of arsenic in the tungsten silicide layer diffused into the polysilicon layer. This diffusion of arsenic corresponds to arsenic diffusion c in FIG. 5A. This indicates that the arsenic concentration is balanced when the concentration in the polysilicon layer is higher than that in the tungsten silicide layer.

From the above results, it is found that the concentration of boron (a p-type impurity) is balanced after the heat treatment of the polycide film when the concentration in the tungsten silicide layer is higher than that in the polysilicon layer. On the other hand, the concentration of arsenic (an n-type impurity) is balanced when the concentration in the polysilicon layer is higher than that in the tungsten silicide layer. The present invention utilizes this distribution property of impurities, wherein it is possible to form the gate electrodes of the p-channel MOS transistor and the n-channel MOS transistor, and the interconnection therebetween from one continuous polycide film.

Figure 5B:
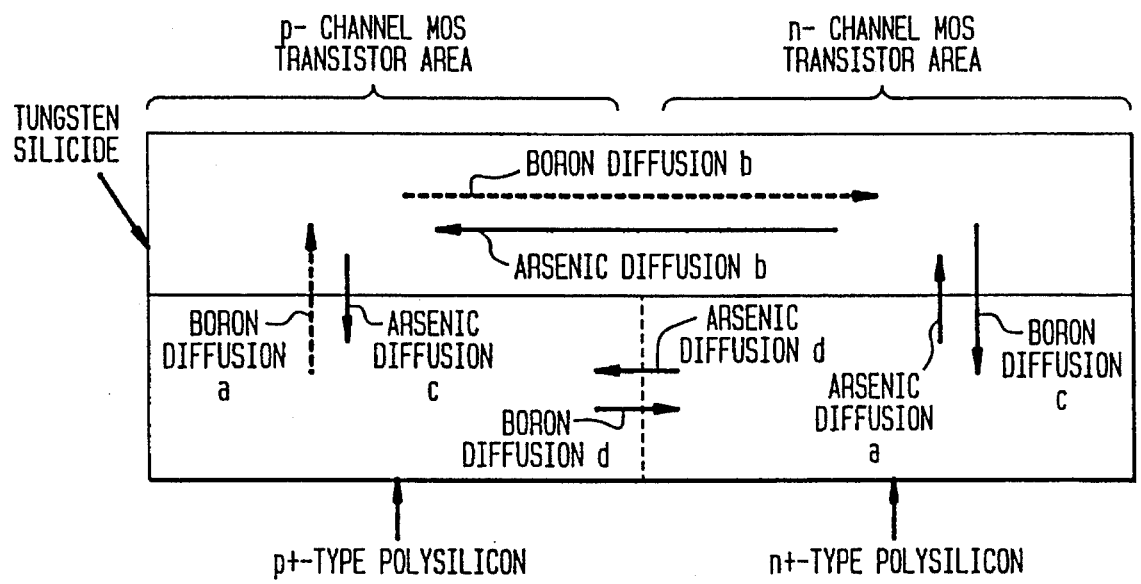

FIG. 5B schematically shows the diffusion paths of the impurities in the semiconductor device according to the present invention. The paths shown by the dotted-line arrows are those that will be substantially eliminated by the present invention.

According to the present invention, boron is implanted into the portion of the tungsten silicide layer 12 in the p-channel MOS transistor area so that the boron concentration therein is at the same level as that in the $p^+$-type polysilicon region 9a. As a result, unlike the diffusion in the conventional semiconductor device, boron in the $p^+$-type polysilicon region 9a does not diffuse into the tungsten silicide layer 12 by heat treatment. This eliminated diffusion of boron corresponds to boron diffusion a as shown by the vertical dotted-line arrow in FIG. 5B.

Further, according to the present invention, boron ions are implanted in the portion of the tungsten silicide layer 12 in the n-channel MOS transistor area so as to obtain the same level of boron concentration as in the portion of the tungsten silicide layer 12 in the p-channel MOS transistor area and thereby to achieve a laterally uniform concentration of boron in the tungsten silicide layer 12. As a result, the diffusion of boron within the tungsten silicide layer 12 from the p-channel MOS transistor area to the n-channel MOS transistor area thereof, is eliminated. This eliminated diffusion of boron corresponds to boron diffusion b as shown by the horizontal dotted-line arrow in FIG. 5B. Thus, the decrease of the boron concentration in the $p^+$-type polysilicon region 9a can be prevented.

According to the present invention, the boron concentration in the tungsten silicide layer 12 is made substantially uniform for the purpose of preventing boron diffusion b. Therefore, any minor variation in the boron concentration in the tungsten silicide layer 12 may be allowed insofar as a change of the boron concentration after heat treatment does not affect the properties of the transistor.

Also, as shown in FIG. 3B, boron contained in the tungsten silicide layer 12 does not significantly diffuse in the $n^+$-type polysilicon region 9b. This diffusion of boron corresponds to boron diffusion c in FIG. 5B. The boron concentration in the $n^+$-type polysilicon region 9b does not increase so much as to affect the characteristics of the transistor.

Further, as shown in FIG. 4A, arsenic contained in the $n^+$-type polysilicon region 9b does not significantly diffuse into the tungsten silicide layer 12, and thus it will not reach the $p^+$-type polysilicon region 9a through the diffusion in the tungsten silicide layer 12. That is, in FIG. 5B, arsenic diffusion b is minor since arsenic diffusion a is small, and arsenic diffusion c is minor since arsenic diffusion b is also minor.

As described above, in the semiconductor device comprising the polycide film in which the $p^+$-type polysilicon is used as a gate electrode for the p-channel MOS transistor and the $n^+$-type polysilicon is used as a gate electrode for the n-channel MOS transistor, boron contained in the $p^+$-type polysilicon region 9a does not decrease after heat treatment by implanting boron into the tungsten silicide layer 12. At the same time, arsenic contained in the $n^+$-type polysilicon region 9b does not diffuse into the $p^+$-type polysilicon region 9a. As a result, according to the present invention, a threshold voltage (Vt) of the p-channel MOS transistor, as well as that of the n-channel MOS transistor, can be stabilized.

EXAMPLE 2

Another example of the semiconductor device according to the present invention will be described. In this example, the polycide film is used for the interconnection between a $p^+$-type diffusion layer and an $n^+$-type diffusion layer.

Figure 6:
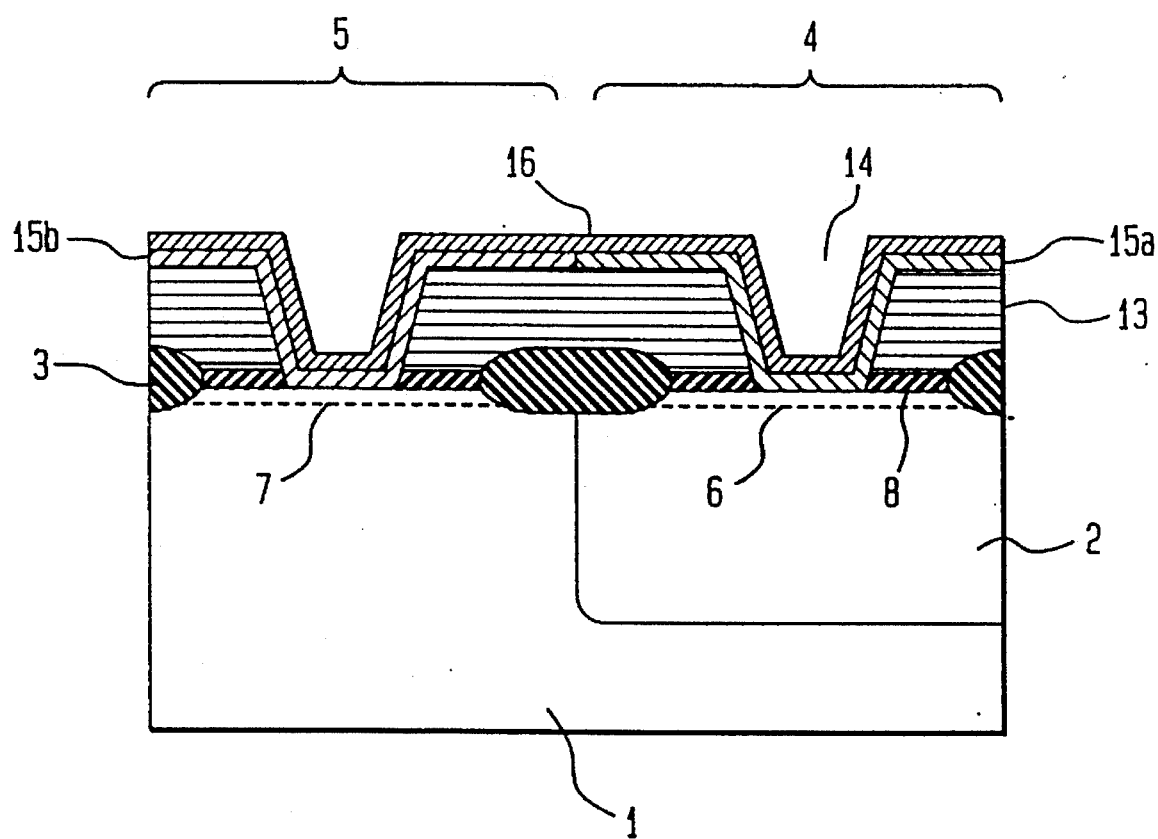
FIG. 6 is a sectional structural view of a main portion of another semiconductor device according to the present invention.

FIG. 6 is a sectional structural view of a main portion of the semiconductor device of this example. The semiconductor device comprises a p-type silicon substrate 1, an $n^-$-type well 2 formed in the silicon substrate 1, isolation regions 3, a $p^+$-type diffusion layer 6, an $n^+$-type diffusion layer 7, a gate oxide film 8, an interlevel insulating film 13, contact holes 14 formed through the interlevel insulating film 13, a polysilicon layer 15 composed of a $p^+$-type polysilicon region 15a and an $n^+$-type polysilicon region 15b, and a tungsten silicide layer 16. The reference numerals 4 and 5 denote a p-channel MOS transistor area and an n-channel MOS transistor area, respectively.

Now, referring to FIG. 6, the method for fabricating the above semiconductor device will be described.

The semiconductor device of this example is fabricated according to the steps described in Example 1 until the $p^+$-type diffusion layer 6 and the $n^+$-type diffusion layer 7 are formed. After this step, the interlevel insulating film 13 is formed over the top surface of the substrate 1 on which patterns have been formed. Then, the contact holes 14 are formed through the interlevel insulating film 13 to reach the $p^+$-type diffusion layer 6 and the $n^+$-type diffusion layer 7. A native oxide layer formed on the open surface by contact with the atmosphere is removed by dip etching using an aqueous solution containing hydrofluoric acid. After this treatment, the $p^+$-type polysilicon region 15a and the $n^+$-type polysilicon region 15b are formed by the method employed when the $p^+$-type polysilicon region 9a and the $n^+$-type polysilicon region 9b are formed as in Example 1. Then, the tungsten silicide layer 16 is formed by the method employed when the tungsten silicide layer 12 is formed as in Example 1. Boron is implanted in the tungsten silicide layer 16 by the same method as in Example 1.

As described above, in this example, as in Example 1, boron is implanted in the tungsten silicide layer 16. Therefore, boron contained in the $p^+$-type polysilicon region 15a does not decrease after heat treatment. At the same time, arsenic contained in the $n^+$-type polysilicon region 15b does not diffuse into the $p^+$-type polysilicon region 15a. As a result, when the $p^+$-type diffusion layer 6 and the $n^+$-type diffusion layer 7 are connected through the polycide film of the present invention, the contact resistance between the $n^+$-type polysilicon region 15a and the $p^+$-type diffusion layer 6 can be kept low, as well as that between the $n^+$-type polysilicon region 15b and the $n^+$-type diffusion layer 7.

In the above examples, boron was implanted in the entire portion of the tungsten silicide layer 16 after the formation thereof. However, any other implantation style is possible insofar as boron diffusion b in FIG. 5A or 5B is prevented. For example, when boron is implanted in at least the portion of the tungsten silicide layer in the region other than the $p^+$-type polycide region, boron diffusion b does not occur and a similar effect to the above can be obtained. In other words, even if the boron concentration in the portion of the tungsten silicide layer in the $p^+$-type polycide region is increased, boron diffusion b occurs insofar as boron is not present in the portion of the tungsten silicide layer in the region other than the $p^+$-type polycide region. As a result, the boron concentration in the $p^+$-type polysilicon region decreases after heat treatment. According to the present invention, the decrease of the boron concentration in the $p^+$-type polysilicon region by heat treatment is prevented by implanting boron as a precaution in any portion where boron is expected to diffuse.

To fabricate the semiconductor device of the present invention, other materials and methods can be used instead of those used in the above examples. For example, a nitride oxide film and the like can be used for the gate oxide film 8. The $n^+$-type polysilicon region and the $p^+$-type polysilicon region can be formed by a thermal diffusion method instead of the ion implantation method. Silicide including metals other than tungsten, such as titanium or molybdenum, can be used to obtain the same effect as in the above examples. Phosphorus can be used as an n-type impurity instead of arsenic to obtain the same effect as in the above example. Boron implantation can be performed by implanting $BF_2^+$ ions instead of $B^+$ ions to obtain the same effect as in the above examples.

In one of the above examples, the gate electrodes of the p-channel MOS transistor and the n-channels MOS transistor and the interconnection therebetween were integrally formed of one continuous polycide film. In the other example, the $p^+$-type diffusion layer 6 and the $n^+$-type diffusion layer 7 were connected by one continuous polycide film. The polycide film employed in the semiconductor device of the present invention can also be used to form interconnections between other portions than the above, such as between a diffusion layer and a gate electrode.

Thus, according to the method for fabricating the semiconductor device of the present invention, in which boron is implanted in the entire portion of the tungsten silicide layer of the polycide film, the amount of boron in the $p^+$-type polysilicon region does not decrease by heat treatment. At the same time, arsenic in the $n^+$-type polysilicon region does not diffuse into the $p^+$-type polysilicon region. As a result, when the polycide film of the present invention is used as gate electrodes for a p-channel MOSFET and subjected to heat treatment, the threshold voltage (Vt) can be stabilized. Also, when the polycide film of the present invention is used for the interconnection between the $n^+$-type diffusion layer and the $p^+$-type diffusion layer, the contact resistance can be kept low.

Furthermore, due to the polycide film applied in the present invention, the electric communication between the p-type polysilicon region and the n-type polysilicon region can be secured without an additional contact area. Also, since the polycide film is durable for heat treatment at 900° C. maintaining the same properties thereof, planarization using a BPSG film is possible. Moreover, conventionally, the distance between the $p^+$-type region and the $n^+$-type region of the polycide film is required to be large enough to prevent the influence of the diffusion in the transverse direction. However, this distance can be shortened according to the structure of the present invention, which can contribute to the reduction of the size of an integrated circuit chip.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device comprising the steps of:

forming an insulating film on a semiconductor substrate;

forming a polysilicon layer on said insulating film;

forming a p-type region and an n-type region in said polysilicon layer;

forming a silicide layer on said polysilicon layer so as to form a polycide film, said silicide layer including a metal selected from a group consisting of tungsten, titanium and molybdenum; and implanting p-type impurities into the entire silicide layer so that said p-type impurities are substantially uniformly distributed in the entire silicide layer.

2. A method according to claim 1, wherein the concentration of said p-type impurities in said silicide layer is higher than that in said p-type region of said polysilicon layer.

3. A method according to claim 1, wherein said p-type impurities are boron.

4. A method according to claim 1, further comprising the step of forming a transistor on said semiconductor substrate using a portion of said polycide film as a gate electrode.

5. A method according to claim 1, further comprising the step of forming an impurity diffusion region in said semiconductor substrate so that said impurity diffusion region is in contact with said polysilicon layer of said polycide film.

6. A method for fabricating a semiconductor device comprising the steps of:

forming an insulating film on a semiconductor substrate;

forming a polysilicon layer on said insulating film;

forming a p-type region and an n-type region in said polysilicon layer;

forming a silicide layer on said polysilicon layer so as to form a polycide film, said silicide layer including a metal selected from a group consisting of tungsten, titanium and molybdenum; and implanting p-type impurities into all of said silicide layer except a portion of said silicide layer located on said p-type region of said polysilicon layer.

7. A method according to claim 6, wherein said p-type impurities are boron.

8. A method according to claim 6, further comprising the step of forming a transistor on said semiconductor substrate using a portion of said polycide film as a gate electrode.

9. A method according to claim 6, further comprising the step of forming an impurity diffusion region in said semiconductor substrate so that said impurity diffusion region is in contact with said polysilicon layer of said polycide film.

* * * * *

UNITED STATES PATENT AND TRADEMARK OFFICE
CERTIFICATE OF CORRECTION

PATENT NO.  : 5,459,101
DATED       : October 17, 1995
INVENTOR(S) : Fujii et al.

It is certified that error appears in the above-identified patent and that said Letters Patent is hereby corrected as shown below:

Title page, item [56] References Cited, U.S. Patent Documents 4,640,844, change "Nappl et al." to --Neppl et al.--.

Title page, item [56] References Cited, U.S. Patent Documents 5,086,006, change "Ashina" to --Asahina--.

Column 1, lines 49 and 50, add --C-- after "1000°" on line 49 and delete "C" on line 50.

Column 2, line 16, "sued" should be --used--.

Column 4, line 38, "$n^{30}$" should be --$n^+$--.

Column 6, line 1, after "silicide" delete --.--.

UNITED STATES PATENT AND TRADEMARK OFFICE
CERTIFICATE OF CORRECTION

PATENT NO.    : 5,459,101
DATED         : October 17, 1995
INVENTOR(S)   : Fujii et al.

It is certified that error appears in the above-identified patent and that said Letters Patent is hereby corrected as shown below:

Column 8, lines 51-52, add --C-- after "900°" on line 51 and delete "C" on line 52.

Signed and Sealed this

Nineteenth Day of March, 1996

Attest:

BRUCE LEHMAN

*Attesting Officer*    *Commissioner of Patents and Trademarks*